(12) United States Patent
Lin et al.

(10) Patent No.: US 7,557,043 B2
(45) Date of Patent: Jul. 7, 2009

(54) METHOD OF FABRICATING THE STACKED STRUCTURE AND DAMASCENE PROCESS

(75) Inventors: Chin-Hsiang Lin, Hsinchu (TW); Chih-Chien Liu, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/154,124

(22) Filed: Jun. 15, 2005

(65) Prior Publication Data

US 2006/0286793 A1 Dec. 21, 2006

(51) Int. Cl.
*H01L 21/311* (2006.01)
(52) U.S. Cl. .................. 438/700; 438/705; 438/736; 257/E21.579
(58) Field of Classification Search .................. 438/637, 438/700, 705, 735, 738, 740, 741; 257/774, 257/E21.579
See application file for complete search history.

(56) References Cited

U.S. PATENT DOCUMENTS

| | | | | |
|---|---|---|---|---|
| 5,652,187 A * | 7/1997 | Kim et al. | .................. | 438/760 |
| 5,763,010 A * | 6/1998 | Guo et al. | ................ | 427/376.2 |
| 6,162,587 A | 12/2000 | Yang et al. | .................. | 430/314 |
| 6,268,287 B1 | 7/2001 | Young et al. | ................ | 438/671 |
| 6,440,640 B1 | 8/2002 | Yang et al. | .................. | 430/314 |
| 6,440,753 B1 | 8/2002 | Ning et al. | ...................... | 438/3 |
| 6,518,646 B1 * | 2/2003 | Hopper et al. | ............. | 257/642 |
| 6,696,222 B2 | 2/2004 | Hsue et al. | ................... | 430/313 |
| 6,706,637 B2 * | 3/2004 | Chen et al. | .................. | 438/700 |
| 6,800,566 B2 * | 10/2004 | Lu et al. | ..................... | 438/761 |
| 2001/0033900 A1 | 10/2001 | M'Saad et al. | ............. | 427/569 |
| 2003/0044725 A1 * | 3/2003 | Hsue et al. | ................. | 430/314 |
| 2003/0211746 A1 * | 11/2003 | Chen et al. | ................. | 438/700 |
| 2003/0211755 A1 * | 11/2003 | Lu et al. | ..................... | 438/778 |
| 2004/0145055 A1 * | 7/2004 | Kobayashi | .................. | 257/751 |
| 2006/0057837 A1 * | 3/2006 | Bhanap et al. | ............. | 438/623 |
| 2006/0057855 A1 * | 3/2006 | Ramos et al. | ............... | 438/710 |

OTHER PUBLICATIONS

Y. J. Mei, T. C. Chang, S. J. Chang, F. M. Pan, M. S. K. Chen, A. Tuan, S. Chou and C. Y. Chang, Stabilizing dielectric constant of fluorine-doped SiO2 film by N2O and NH3 plasma post-treatment, Thin Solid Films, vol. 308-309, , Oct. 31, 1997, pp. 501-506. (http://www.sciencedirect.com/science/article/B6TW0-4CYFSYY-37/2/5d8aa93801f628fecc571.*

* cited by examiner

*Primary Examiner*—Matthew Smith
*Assistant Examiner*—Jarrett J Stark
(74) *Attorney, Agent, or Firm*—J.C. Patents

(57) ABSTRACT

A method of fabricating a stacked structure for forming a damascene process is described. A doped dielectric layer is formed on a substrate. A surface treatment is performed to the dielectric layer to make the dopant concentration in an upper surface layer of the dielectric layer lower than that in the other portions of the dielectric layer. A metal hard mask is then formed on the dielectric layer. Since the dopant conc. in the upper surface layer of the dielectric layer is lowered, the reaction between the metal hard mask and the dopant in the dielectric layer can be inhibited.

16 Claims, 3 Drawing Sheets

METHOD OF FABRICATING THE STACKED STRUCTURE AND DAMASCENE PROCESS

BACKGROUND OF THE INVENTION

1. Field of the Invention

The present invention relates to a semiconductor device structure and a method of fabricating the same. More particularly, the present invention relates to a stacked structure containing a metal hard mask for forming a damascene structure, a method for fabricating the stacked structure, and a damascene process utilizing the same method. The method is capable of inhibiting the reaction between the metal hard mask and a dopant in the underneath dielectric layer.

2. Description of the Related Art

With rapid developments in semiconductor technology, dimensions of IC devices unceasingly get smaller to the order of deep sub-micron. When the integration degree of integrated circuits is required up to a certain level, the die surface is insufficient for forming all interconnects in one layer. Hence, multi-level interconnects are adopted in current ultra-large scale integrated (ULSI) circuits.

In a metal interconnect damascene process, a thicker photoresist layer is usually required to prevent over-consumption of photoresist in the etching/defining step of the dielectric layer. However, since the wavelength of the exposure light used currently is short, the accuracy of pattern transfer is limited by the depth of focus (DOF) when the photoresist layer is thick.

The above problem can be overcome by forming a metal hard mask on the dielectric layer before the photoresist layer is formed, because the etching selectivity to dielectrics relative to metal is quite high in the etching step of the dielectric layer. Thereby, a thinner photoresist layer can be used to make accurate pattern transfer. However, when a metal hard mask is used and the dielectric layer is doped, there may be reaction occurring between the metal hard mask and the dopant in the dielectric layer to cause some problems decreasing the yield. For example, when a metal hard mask contains titanium (Ti) and the underneath dielectric layer is doped with fluorine (F), titanium will react with fluorine diffusing out of the dielectric layer to form titanium fluoride particles and therefore cause bevel defects in the damascene process.

SUMMARY OF THE INVENTION

In view of the foregoing, one object of this invention is to provide a method of fabricating a stacked structure for forming a damascene structure, which can inhibit the reaction between the metal hard mask and a dopant in the underneath dielectric layer.

Another object of this invention is to provide a damascene process capable of inhibiting the reaction between the metal hard mask and a dopant in the underneath dielectric layer.

Still another object of this invention is to provide a stacked structure for forming a damascene structure.

The method of fabricating a stacked structure for forming a damascene structure of this invention is described as follows. A doped dielectric layer is formed on a substrate, and then a surface treatment is performed to the dielectric layer to make the dopant concentration in an upper surface layer of the dielectric layer lower than that in the other portions of the dielectric layer. A metal hard mask is then formed on the dielectric layer.

According to one embodiment of this invention, an insulating hard mask may be further formed on the metal hard mask to help defining the dielectric layer.

The damascene process of this invention is described as follows. After a stacked structure as mentioned above is formed, a trench pattern is formed in the metal hard mask, and then a photoresist layer having a via-hole pattern therein is formed over the substrate. The photoresist layer is used as an etching mask to remove a portion of the dielectric layer, so as to transfer the via-hole pattern to the dielectric layer to form a via hole in the latter. After the photoresist layer is removed, the metal hard mask is used as an etching mask to remove a portion of the dielectric layer, so as to transfer the trench pattern to the dielectric layer to form a trench in the dielectric layer. Thereafter, a metal layer is filled into the via hole and the trench, and then the metal hard mask is removed.

According to an embodiment of this invention, the dielectric layer may include a low-k material having a dielectric constant lower than 4, such as, fluorosilicate glass (FSG) or carbon-doped glass. The metal hard mask may include at least one material selected from the group consisting of Ti, TiN, Ti/TiN, Ta, TaN, Ta/TaN, W, WN and W/WN. The upper surface layer of the dielectric layer, which is formed through the surface treatment to have a lower dopant concentration, may have thickness of 3-500 Å.

In addition, when the dielectric layer includes FSG, the surface treatment may utilize oxygen-containing plasma that is generated from a reactive gas including at least one gas selected from the group consisting of $N_2O$, $O_2$, $O_3$ and $CO_2$, while helium (He) gas may also be introduced. When the dielectric layer includes carbon-doped glass, the surface treatment may utilize a plasma-generating gas including at least one gas selected from the group consisting of He, Ar and $CO_2$.

Moreover, according to an embodiment of this invention, an insulating hard mask may be further formed on the metal hard mask to help defining the dielectric layer before the trench pattern is formed in the metal hard mask. The insulating hard mask and the metal hard mask are then patterned sequentially to form a trench pattern therein.

The stacked structure for forming a damascene structure of this invention includes a substrate, a dielectric layer on the substrate and a metal hard mask on the dielectric layer. The dielectric layer is doped, and the dopant concentration in an upper surface layer of the dielectric layer is lower than that in the other portions of the dielectric layer.

Since the dopant concentration in the upper surface layer of the dielectric layer is lower than that in the other portions of the dielectric layer, the reaction between the metal hard mask and the dopant in the dielectric layer can be inhibited. Consequently, the adverse affects caused by the reaction can be reduced.

It is to be understood that both the foregoing general description and the following detailed description are exemplary, and are intended to provide further explanation of the invention as claimed.

DESCRIPTION OF THE PREFERRED EMBODIMENTS

An embodiment of the method of fabricating a stacked structure for forming a damascene structure of this invention will be described referring to FIGS. 1A-1C.

Figure 1A:
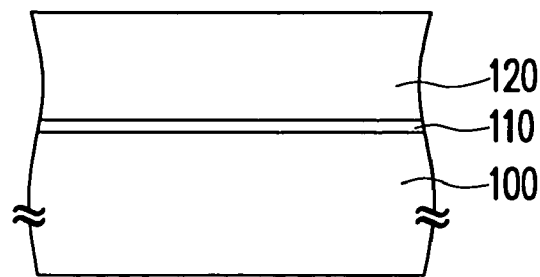
FIGS. 1A-1C illustrate, in a cross-sectional view, a process flow of a method of fabricating a stacked structure for forming a (dual) damascene structure according to a preferred embodiment of this invention.

Referring to FIG. 1A, a doped dielectric layer 120 is formed on a substrate 100. The material of the dielectric layer 120 is, for example, a low-k material having a dielectric constant lower than 4, such as, fluorosilicate glass (FSG) or carbon-doped glass. Before the dielectric layer 120 is formed, the substrate 100 is usually formed with a cap layer 110 thereon that includes, for example, silicon nitride (SiN) or silicon oxynitride (SiON).

Figure 1B:
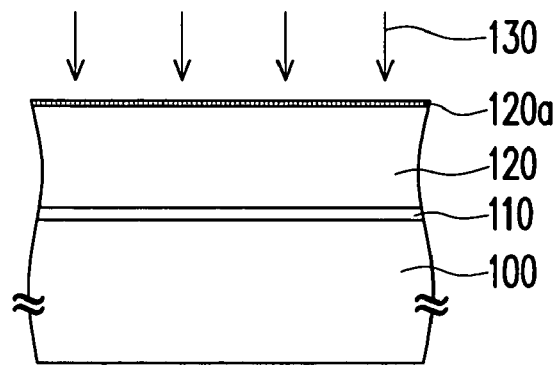

Referring to FIG. 1B, after the dielectric layer 120 is formed, a surface treatment 130 is conducted to lower the dopant concentration in an upper surface layer 120a of the dielectric layer 120. The surface treatment 130 may be a plasma treatment that makes the dopant concentration in the upper surface layer 120a of the dielectric layer 120 lower than that in the other portions of the dielectric layer 120. The thickness of the upper surface layer 120a formed with the surface treatment 130 is preferably 3-500 Å.

Moreover, when the dielectric layer 120 includes FSG, the surface treatment 130 may, for example, utilize oxygen-containing plasma that is preferably generated from a reactive gas including at least one gas selected from the group consisting of $N_2O$, $O_2$, $O_3$ and $CO_2$, while helium (He) gas may also be introduced. When the dielectric layer 120 includes carbon-containing glass, the plasma-generating gas preferably includes at least one gas selected from the group consisting of He, Ar and $CO_2$.

The conditions of the surface treatment 130 depend on the type of the treating machine being used. In an example, the treatment temperature is set as 350-400° C., the high-frequency (HF) RF power is controlled within a range of 100-1500W, and the time of the treatment is set as 10-60 seconds. The gas for generating oxygen-containing plasma includes $N_2O$, in a flow rate of 100-10000 sccm preferably.

Figure 1C:
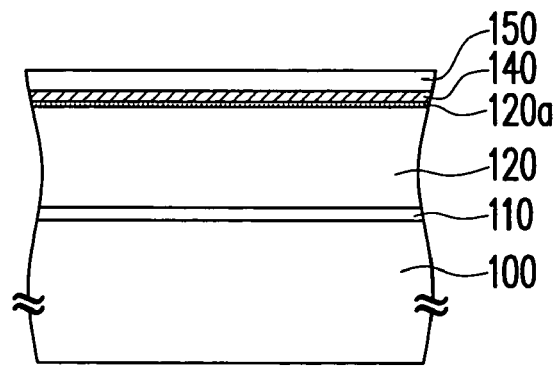

Referring to FIG. 1C, a metal hard mask 140 is formed on the dielectric layer 120. The metal hard mask 140 may, for example, include at least one material selected from the group consisting of Ti, TiN, Ti/TiN, Ta, TaN, Ta/TaN, W, WN and W/WN.

If required, an insulating hard mask 150 can be further formed on the metal hard mask 140. The material of the insulating hard mask 150 may be silicon oxide formed through plasma-enhanced chemical vapor deposition (PECVD).

To make one of ordinary skills further understand the applications of the above stacked structure of this invention to a (dual) damascene process, an exemplary process is described below referring to FIGS. 2A-2D. The example is not intended to restrict the scope of this invention.

Figure 2A:
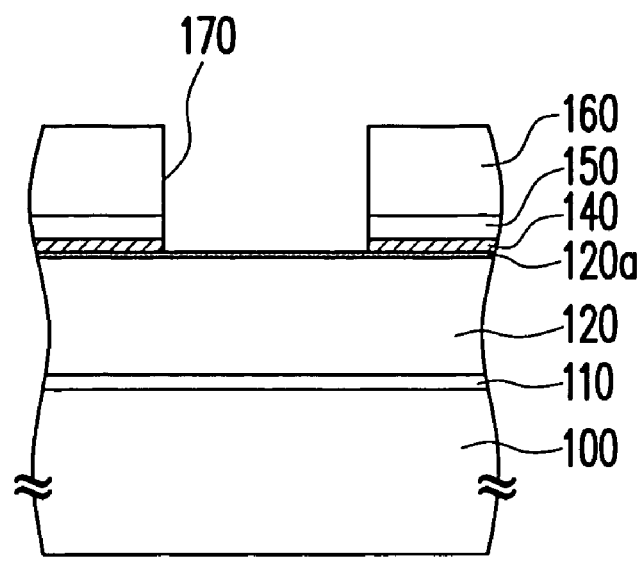
FIGS. 2A-2D illustrate, in a cross-sectional view, a process flow of a dual damascene process starting with the above stacked structure according to the preferred embodiment of this invention.

Referring to FIG. 2A, a cap layer 110, a dielectric layer 120 having an upper surface layer 120a with a dopant concentration lower than that in the other portions, a metal hard mask 140 and an insulating hard mask 150 are sequentially formed over the substrate 100 as above. A photoresist layer 160 having a trench pattern 170 therein is formed on the insulating hard mask 150. An etching step is then conducted to transfer the trench pattern 170 to the insulating hard mask 150 and the metal hard mask 140.

Figure 2B:
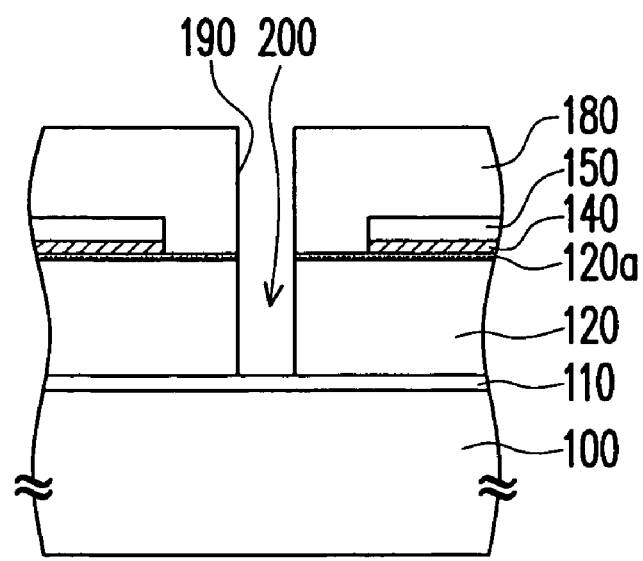

Referring to FIG. 2B, the photoresist layer 160 is removed, and then another photoresist layer 180 having a via/contact-hole pattern 190 therein is formed on the insulating hard mask 150. An etching step is then conducted to transfer the via/contact-hole pattern 190 to the dielectric layer 120 to form a via/contact hole 200 therein.

Figure 2C:
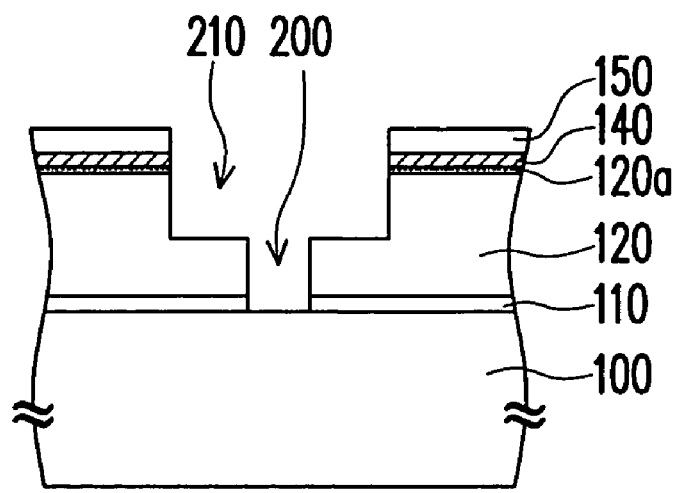

Referring to FIG. 2C, the photoresist layer 180 is removed, and then the insulating hard mask 150 and the metal hard mask 140 are used as an etching mask to etch the dielectric layer 120 to form a trench 210 therein. The cap layer 110 exposed by the via/contact hole 200 is then removed to expose a portion of the substrate 100.

Figure 2D:
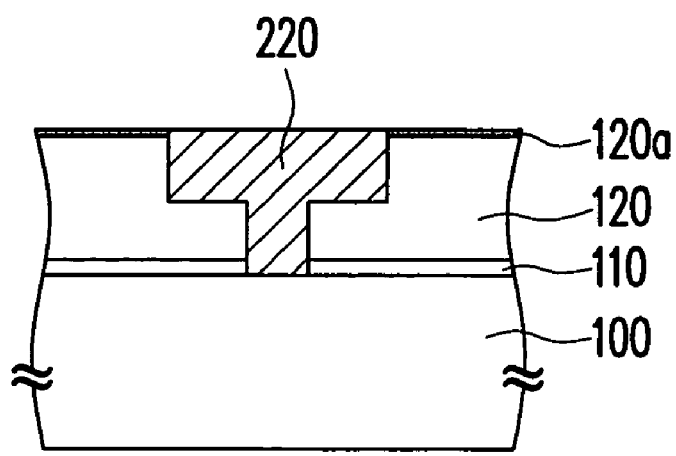

Referring to FIG. 2D, a metal layer 220 is filled into the trench 210 and the via/contact hole 200 (FIG. 2C) by, for example, depositing a metal material like copper (Cu) or tungsten (W) over the whole substrate 100 and then removing the metal material on the insulating hard mask 150 with chemical mechanical polishing (CMP). Then, the insulating hard mask 150 and the metal hard mask 140 are removed.

It is noted that in the special case where the metal hard mask contains Ti and the dielectric layer is doped with F, the surface treatment to the dielectric layer lowers the fluorine concentration in an upper surface layer of the dielectric layer, so that the number of $TiF_x$ particles produced from T-F reaction can be reduced to decrease bevel defects.

In summary, since the dopant (carbon, fluorine, or the like) concentration in the upper surface layer of the dielectric layer is made lower than that in the other portions of the dielectric layer, the reaction between the metal hard mask and the dopant in the dielectric layer can be inhibited to reduce the adverse affects caused by the reaction.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of fabricating a stacked structure for forming a damascene structure, comprising:
    forming a dielectric layer doped with a dopant on a substrate;
    after forming the dielectric layer, performing a plasma surface treatment to the dielectric layer to make a dopant concentration in an upper surface layer of the dielectric layer lower than a dopant concentration in the other portions of the dielectric layer; and
    forming a metal hard mask directly on the dielectric layer so that the metal hard mask directly contacts the upper surface layer of the dielectric layer having lower dopant concentration.

2. The method of claim 1, wherein the metal hard mask comprises at least one material selected from the group consisting of Ti, TiN, TiFfiN, Ta, TaN, Ta/TaN, W, WN and W/WN.

3. The method of claim 2, wherein the doped dielectric layer comprises a low-k material having a dielectric constant lower than 4.

4. The method of claim 3, wherein the low-k material comprises fluorosilicate glass (FSG).

5. The method of claim 4, wherein the plasma surface treatment utilizes oxygen- containing plasma that is generated from a reactive gas comprising at least one gas selected from the group consisting of $N_2O$, $O_2$, $O_3$ and $CO_2$.

6. The method of claim 5, wherein helium (He) gas is also introduced in the surface treatment.

7. The method of claim 1, wherein a thickness of the upper surface layer of the dielectric layer is about 3-500 Å.

8. The method of claim 1, further comprising forming an insulating hard mask on the metal hard mask.

9. A damascene process, comprising:
   forming a dielectric layer doped with a dopant on a substrate;
   after forming the dielectric layer, performing a plasma surface treatment to the dielectric layer to make a dopant concentration in an upper surface layer of the dielectric layer lower than a dopant concentration in the other portions of the dielectric layer;
   forming a metal hard mask directly on the dielectric layer so that the metal hard mask directly contacts the upper surface layer of the dielectric layer having lower dopant concentration;
   forming a french pattern in the metal hard mask;
   forming a photoresist layer having a via-hole pattern therein over the substrate;
   using the photoresist layer as an etching mask to remove a portion of the dielectric layer, so as to transfer the via-hole pattern to the dielectric layer to form a via hole therein;
   removing the photoresist layer;
   using the metal hard mask as an etching mask to remove a portion of the dielectric layer, so as to transfer the trench pattern to the dielectric layer to form a trench therein;
   filling a metal layer into the via hole and the trench; and
   removing the metal hard mask.

10. The damascene process of claim 9, wherein the metal hard mask comprises at least one material selected from the group consisting of Ti, TiN, Ti/TiN, Ta, TaN, Ta/TaN, W, WN and W/WN.

11. The damascene process of claim 10, wherein the dielectric layer comprises a low-k material having a dielectric constant lower than 4.

12. The damascene process of claim 11, wherein the low-k material comprises fluorosilicate glass (FSG).

13. The damascene process of claim 12, wherein the plasma surface treatment utilizes oxygen-containing plasma that is generated from a reactive gas comprising at least one gas selected from the group consisting of $N_2O$, $O_2$, $O_3$ and $C_2$.

14. The damascene process of claim 13, wherein helium (He) gas is also introduced in the surface treatment.

15. The damascene process of claim 9, wherein a thickness of the upper surface layer of the dielectric layer is about 3-500 Å.

16. The damascene process of claim 9, further comprising: forming an insulating hard mask on the metal hard mask before the trench pattern is formed in the metal hard mask, while the trench pattern is transferred to both of the insulating hard mask and the metal hard mask.

* * * * *